United States Patent [19]
Fields, Jr.

[11] 3,956,902
[45] May 18, 1976

[54] HEATING AND COOLING SYSTEM

[76] Inventor: Joe C. Fields, Jr., 16023 Debbie Lane, Channelview, Tex. 77530

[22] Filed: Mar. 25, 1975

[21] Appl. No.: 561,689

[52] U.S. Cl. .................................. 62/3; 62/260; 290/55
[51] Int. Cl.² ................... F25B 21/02; F25D 23/12; F03D 9/00; H02P 9/04
[58] Field of Search ............ 62/3, 260, 236; 290/44, 290/55

[56] References Cited
UNITED STATES PATENTS

| | | | |
|---|---|---|---|
| 2,153,523 | 4/1939 | Roberts | 290/55 |
| 2,539,862 | 1/1951 | Rushing | 62/260 |
| 2,986,009 | 5/1961 | Gaysowski | 62/3 |
| 3,077,079 | 2/1963 | Pietsch | 62/3 |
| 3,121,998 | 2/1964 | Nagata | 62/3 |
| 3,138,934 | 6/1964 | Roane | 62/3 |
| 3,302,414 | 2/1967 | Sudmeier | 62/3 |
| 3,426,214 | 2/1969 | O'Malley | 290/55 |
| 3,552,133 | 1/1971 | Lukomsky | 62/3 |

Primary Examiner—Lloyd L. King
Attorney, Agent, or Firm—Torres & Berryhill

[57] ABSTRACT

A heating and cooling system for an enclosure utilizing electricity generated from wind energy. The system may include a windmill mechanically linked to a plurality of low voltage electrical generators. The electricity is supplied to a plurality of thermoelectric devices which effect heating and cooling of the enclosure. The system is thermostatically controlled and can be employed with existing heating and cooling systems as the primary source of heating and cooling.

11 Claims, 2 Drawing Figures

HEATING AND COOLING SYSTEM

BACKGROUND OF THE INVENTION

1. Field of the Invention

The present invention relates to systems for heating and cooling enclosures. More particularly, the present invention relates to a heating and cooling system utilizing wind energy to generate electricity, which in turn is used by thermoelectric devices to effect interior heating or cooling of the enclosure. In a specific application, the present invention is employed to heat and cool the interior of a building, by converting wind energy to electrical energy for use by a thermoelectric heating and cooling device.

2. Brief Description of the Prior Art

Presently, conventional heating and cooling systems for use with buildings employ electricity or petroleum to effect heating or cooling of the air within the building. In general, the electricity is produced by generators driven by internal combustion engines, steam turbines which use steam created by boiling water, gas turbines, or the like. In any event, petroleum and coal are the primary source of energy used to generate the electricity.

With the increasing cost of petroleum, coal and other hydrocarbons, there is an increasing demand for alternate sources of low-cost energy. One alternative source for generating low-cost electricity is nuclear energy which is presently under attack by many environmental groups. The use of solar and wind energy as a source of low-cost energy is still in the early stages of development. In any event, conservation of existing hydrocarbons is of utmost importance.

To this end, many systems have been developed to help conserve energy but have failed in one way or another. In the past, wind energy has been used to generate electricity as disclosed in U.S. Pat. Nos. 1,334,485; 1,355,672; and 1,978,143. These patents disclose an electric generator connected with a windmill. In a typical system, wind energy causes the windmill to rotate a generator which is connected to the windmill by a suitable drive arrangement. Generally, the electricity generated by windmills is used for illumination or to charge storage batteries so that power is available when there is no wind. The use of wind energy as a source of energy, has been very inefficient and impractical for generating electricity as a source of conventional household power. As for providing electricity for heating and cooling, the capacity of the windmill generators is of limited output and not capable of generating sufficient electrical power to operate conventional heating and cooling systems. Because of the variation in the output of the generator powered by wind energy, the conventional compressor type system cannot be easily adapted.

SUMMARY OF THE INVENTION

The present invention provides a heating and cooling system for use with a building which utilizes wind energy to generate electricity used in the system. A suitable wind-driven assembly or windmill is mounted on the building and connected to a plurality of conventional low-voltage generators. High voltage could also be used by dropping the voltage through several circuits. Heating and cooling is effected by employing a plurality of thermoelectric devices which utilize the Peltier effect. The thermoelectric devices transfer heat energy from one place to another using electrical energy as a carrier instead of a refrigerant as in a conventional cooling system.

The thermoelectric devices preferably operate at low voltages because at higher voltages, heat transfer becomes a significant problem. Thus, the present invention may employ conventional automobile generators or alternators to generate the electricity used by the thermoelectric devices. The electrical power generated is direct current (DC) having a low voltage and high current. The voltage output should have little or no ripple since a large amount of ripple in the output reduces the efficiency of the thermoelectric device.

In the preferred embodiment, the heating and cooling system of the present invention is employed as the primary source of heating or cooling. It may be used in conjunction with the existing systems and may employ the air ducts of an existing system. In the event that the thermoelectric system cannot handle peak cooling or heating loads, the existing system can be called on to supplement the thermoelectric system. It should be appreciated that in some areas, the thermoelectric system may be used as the only source of heating and cooling.

One of the advantages of using thermoelectric devices is that heating and cooling is effected by the same device without the use of conventional equipment such as a compressor, evaporator, condenser and refrigerant. Heating or cooling by the device is dependent on the polarity of the voltage across the device. Since electric current is the only requirement, cooling or heating in several different locations can be provided by one source of power. The thermoelectric devices can also operate in any position.

One of the objects of the present invention is to provide a simple heating and cooling system for use with a building.

Another object of the present invention is to provide a heating and cooling system which utilizes wind energy to generate electrical power for use by thermoelectric devices. It should be appreciated that, by utilizing wind energy, the heating and cooling system of the present invention helps to conserve scarce energy sources.

Other objects, features and advantages of the present invention will become more readily apparent from the accompanying drawings, specification and claims.

DESCRIPTION OF THE ILLUSTRATED EMBODIMENT

Figure 1:
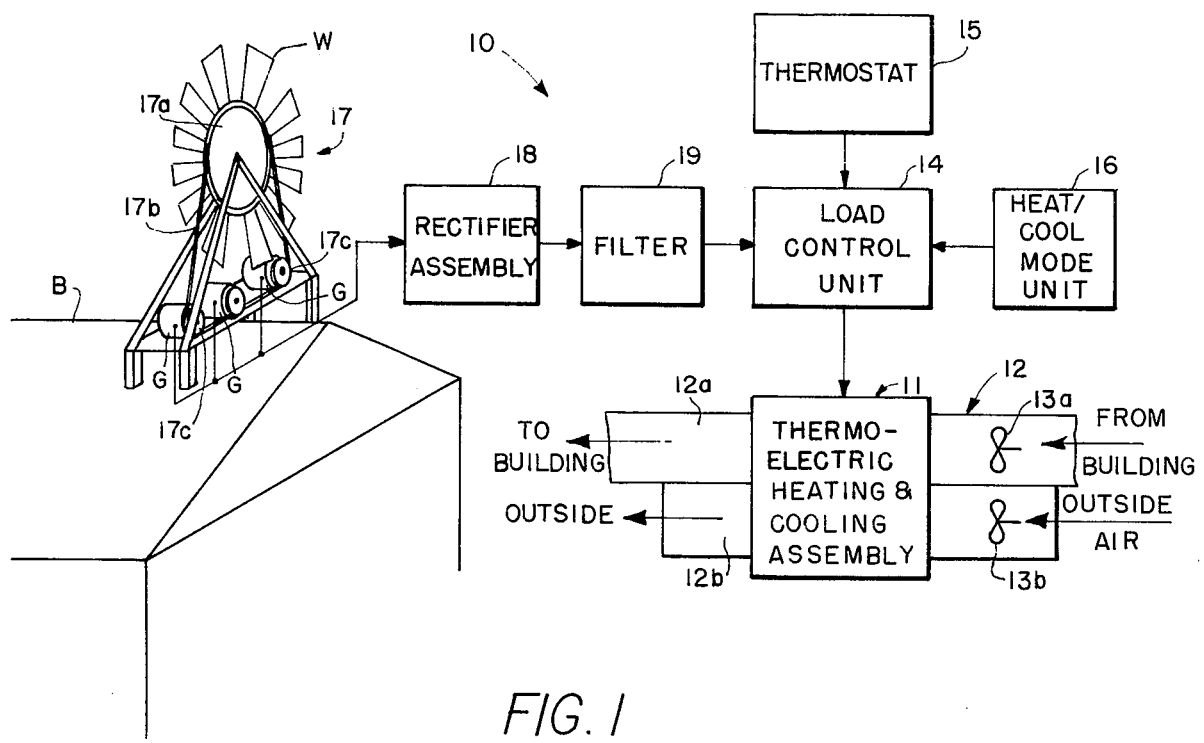
FIG. 1 is a diagrammatic representation of the enclosures and heating and cooling system of the present invention.

Referring now to the drawings, and more particularly to FIG. 1, a building B is shown employing the heating and cooling system of the present invention, indicated generally at 10. A wind-driven assembly or windmill W, mounted on the building B in any suitable manner, utilizes wind energy to generate electricity used by the heating and cooling system 10.

Heating and cooling of the building B is effected by a thermoelectric assembly 11. The thermoelectric assembly 11 utilizes electrical energy in the form of low DC voltage to heat and cool the interior of the building B through a suitable duct system 12 which may be connected with conventional air ducts (not illustrated). The duct system 12 includes an intake air duct 12a and an exhaust air duct 12b. Suitable blowers 13a and 13b are disposed in the air ducts 12a and 12b respectively to circulate air over the thermoelectric assembly 11.

The blowers 13a and 13b could be connected directly to the windmill and designed so that the amount of air circulating would match the output of the thermoelectric device. This would render the entire unit self-sufficient.

It should be mentioned that in some applications brine is used to transfer heat or cold through buildings. These are usually large applications such as apartment or office buildings where water is circulated constantly. It would be very easy to adapt the present thermoelectric system to this type of application.

Electricity to the thermoelectric assembly 11 is supplied through a load control unit 14. The load control unit 14 designed to increase or decrease the heating and cooling capability of the thermoelectric assembly 11 as dicated by demand. Load control is designed to match the load of the thermoelectric device with the output O, the generator so that some cooling is utilized when the output of generator is low. This is done by having only the number of thermoelectric devices needed in the circuit to match the output of generator. A suitable thermostat 15 is employed to turn the heating and cooling system 10 on and off. The thermostat 15 may be a two-stage thermostat in which the first stage turns the system 10 on and off while the second stage may be employed to turn a conventional heating and cooling system on and off.

To selectively effect heating or cooling of the interior of the building B, a heat/cool mode unit 16 may be employed. The unit 16 reverses the voltage polarity applied to the thermoelectric assembly 11.

As mentioned previously, wind energy is utilized to generate the electricity used for heating and cooling the building B. To this end, a plurality of electrical generators G are suitably connected to the windmill W. In the illustrated embodiment, a drive assembly 17, including a main drive pulley 17a mounted on the windmill W, a drive belt 17b, and generator pulleys 17c are employed to transfer rotational movement of the windmill to the generator G. It should be appreciated that any suitable drive assembly that is capable of transmitting rotational movement can be employed for the drive assembly 17. An alternate form of drive assembly may be of the type which includes a crankshaft and connecting rod.

The electrical generators G are of the type which provide a low-voltage, high current output. In the illustrated embodiment, the electrical generators G are conventional automotive-type alternators which produce a low voltage, high current AC output. Since the thermoelectric assembly 11 operates on DC voltage, the AC output from the generators G must be rectified. To this end, a conventional low voltage, high current rectifier assembly 18 may be utilized. The rectified voltage is filtered in a filter network 19 to provide a DC voltage having a low ripple voltage. The efficiency of the thermoelectric assembly 11 decreases rapidly with an increase in the ripple voltage. The filtered DC voltage is supplied to the load control unit 16 which, in turn, controls the heating and cooling capacity of the thermoelectric assembly 11. Again, it should be appreciated that the alternators used to generate electrical energy may be conventional DC generators. When using DC generators, the rectifier assembly 18 may be eliminated.

Figure 2:
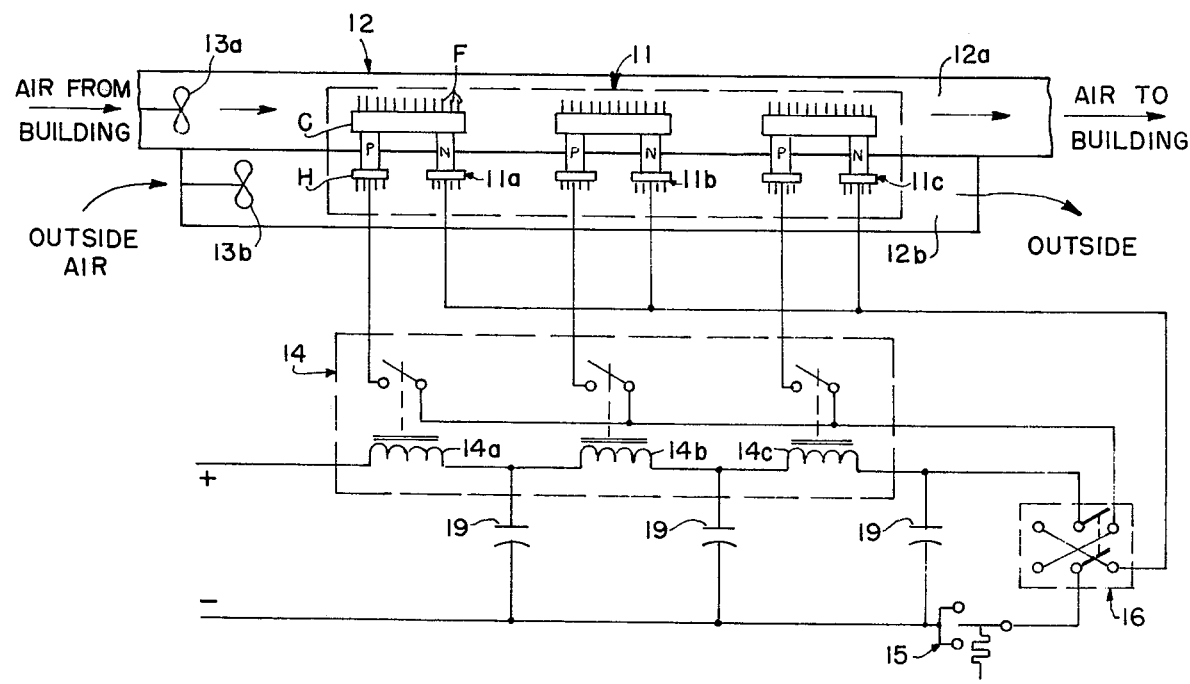
FIG. 2 is a schematic diagram of a portion of the circuitry employed in the heating and cooling system of the present invention.

With reference to FIG. 2, the operation of the heating and cooling system 10 will be discussed. As illustrated, the thermoelectric assembly 11 is disposed in the air duct 12. The thermoelectric assembly includes a plurality of thermoelectric devices 11a, 11b, and 11c, connected in parallel. An increase in the heating and cooling capacity of the system 10 would require that additional thermoelectric units 11 be connected in parallel. The thermoelectric devices are of the type in which heat energy is transferred from one area to another when a direct current is passed through the device. The thermoelectric devices may be constructed of two dissimilar semiconductor materials (P and N). As direct current is passed through the dissimilar semiconductors, heat is liberated at one junction H, disposed in air duct 12b, while heat is absorbed at the other junction C in air duct 12a. To increase the heat transfer, a plurality of pins F may be utilized to increase the exposed surface area.

By reversing the flow of current through the device 11, the junctions H and C will be reversed. Thus junction C will liberate heat in the air duct 12a and junction H will absorb heat in air duct 12b. The heat/cool mode unit 16 is employed to reverse the current flow through each thermoelectric device 11a, 11b, and 11c. The heat/cool mode unit 16 may be a simple double-pole double throw switch as illustrated, or it may be a relay actuated switch.

In certain areas where the outside air temperature drops very low, thermoelectric heating would not be practical because of the fact that heat has to be transferred from the outside to the inside of a building. In this situation, a resistance heating coil could be employed, rather than thermoelectric heat.

The thermostat 15 completes the electrical circuit to control the interior temperature of the building B within a predetermined temperature range. The heating and cooling capacity of the system 10 is controlled by the load control unit 14 which includes a plurality of current relays 14a, 14b, and 14c. The current relays 14a, 14b, and 14c supply electrical power to the respective thermoelectric devices 11a, 11b, and 11c. The current relays 14a, 14b, and 14c are energized at different current levels. Thus, as the current drawn by the thermoelectric device 11a increases, the current through the relay coils 14 increase and at higher current levels, successive relays are energized to in turn supply electrical power to the respective thermoelectric device. To maintain a relatively low ripple DC voltage, suitable filter capacitors 19 are employed.

Since the output of the generator varies considerably because of the amount of wind present at any given time, the maximum cooling or heating possible will not always be utilized. However, as long as there is any wind available there will be some cooling or heating. This source will be constant, as long as the thermostat is demanding heating or cooling and the energy source is available.

From the foregoing, it should be appreciated that the heating and cooling system of the present invention provides a way to conserve scarce energy sources by utilizing relatively cheap wind energy to generate electricity for use by a heating and cooling system. Furthermore, the maintenance required in conventional heating and cooling systems may be reduced.

The foregoing disclosure and description of the invention is illustrative and explanatory thereof, and various changes in the size, shape and materials as well as in the details of the illustrated construction may be made within the scope of the appended claims without departing from the spirit of the invention.

I claim:

1. A system for heating and cooling an enclosure comprising:
   a. first energy converting means for converting wind energy to mechanical energy;
   b. second energy converting means associated with said first converting means and adapted to convert said mechanical energy to varying amounts of electrical energy in proportion to the amount of said wind energy for use in said heating and cooling system;
   c. thermoelectric heating and cooling means comprising a plurality of parallel connected thermoelectric devices connected to said second energy converting means for converting said electrical energy to thermal energy, said thermal energy being employed to heat and cool the interior of said enclosure; and
   d. control means associated with said thermoelectric heating and cooling means responsive to changes in said varying amounts of electrical energy to selectively and sequentially activate and deactivate ones of said thermoelectric devices to match the thermal energy generated by said thermoelectric means with the amount of said wind energy.

2. A system as defined in claim 1 wherein said first converting means is of the type for converting wind energy to rotary mechanical movement.

3. A system as defined in claim 2 wherein said first converting means includes a windmill having a drive assembly for transferring said rotary movement to said second converting means.

4. A system as defined in claim 1 wherein said second converting means includes electrical generating means for generating a high current, low voltage output.

5. A system as defined in claim 4 wherein said electrical generating means comprises a conventional alternator of the automotive type generating a low voltage, alternating current output.

6. A system as defined in claim 5 wherein said second converting means further includes rectifier means for rectifying the output of said electrical generating means whereby said output is a low voltage, high direct current.

7. A system as defined in claim 1 wherein at least one of said thermoelectric devices is disposed in an iar duct having a first air circulating portion through which air circulates from outside said enclosure and a second air circulating portion through which air circulates from inside said enclosure, said thermoelectric device comprising two dissimilar semiconductor materials in which heat is liberated at a first junction and absorbed at a second junction when a direct current is passed through said device, said first junction being disposed in said first air duct portion and said second junction being disposed in said second air duct portion.

8. A system as defined in claim 1 wherein said control means includes a plurality of relays, one of said relays being associated with one of said thermoelectric devices and energizable upon a successive incremental increase in the electrical energy generated by said second energy converting means to supply electrical power to other of said thermoelectric devices in said system.

9. A system as defined in claim 1 wherein said control means further includes mode control means for controlling the operating mode of said thermoelectric devices, said mode control means including polarity reversing means for reversing the polarity of said direct current so that said first junction becomes a heat liberator and said second junction becomes a heat absorber.

10. A system as defined in claim 1 in combination with a conventional heating and cooling unit and including thermostat means connected to said system and said conventional unit for turning said conventional unit on and off in response to over or underloading of said system.

11. A system as defined in claim 1 wherein said second converting means includes electrical generating means for generating a low current, high voltage output.

* * * * *